(12) United States Patent
Sutardja et al.

(10) Patent No.: US 7,071,863 B1
(45) Date of Patent: Jul. 4, 2006

(54) LOW POWER ANALOG TO DIGITAL CONVERTER HAVING REDUCED BIAS DURING AN INACTIVE PHASE

(75) Inventors: Sehat Sutardja, Los Altos Hills, CA (US); Farbod Aram, Cupertino, CA (US)

(73) Assignee: Marvell International Ltd., Hamilton (BM)

( * ) Notice: Subject to any disclaimer, the term of this patent is extended or adjusted under 35 U.S.C. 154(b) by 0 days.

(21) Appl. No.: 11/242,691

(22) Filed: Oct. 4, 2005

Related U.S. Application Data

(62) Division of application No. 10/946,321, filed on Sep. 21, 2004, now Pat. No. 6,967,610, which is a division of application No. 10/313,369, filed on Dec. 6, 2002, now Pat. No. 6,839,015.

(51) Int. Cl.
*H03M 1/38* (2006.01)
*H03M 1/12* (2006.01)

(52) U.S. Cl. .................................. 341/161; 341/172

(58) Field of Classification Search ................ 341/161, 341/143, 155, 172, 150; 323/282; 327/170, 327/337, 541; 330/9, 254; 331/17; 348/241; 360/66
See application file for complete search history.

(56) References Cited

U.S. PATENT DOCUMENTS

| | | | | |
|---|---|---|---|---|
| 5,294,928 A | | 3/1994 | Cooper et al. ............... 341/142 |
| 5,790,334 A | * | 8/1998 | Cunningham ................. 360/66 |
| 5,841,383 A | | 11/1998 | Regier ........................ 341/122 |
| 5,914,681 A | | 6/1999 | Rundel ....................... 341/135 |
| 5,978,163 A | * | 11/1999 | Cunningham ................. 360/66 |
| 6,037,891 A | | 3/2000 | Griph ........................ 341/161 |
| 6,051,999 A | * | 4/2000 | To et al. ....................... 327/66 |
| 6,057,795 A | | 5/2000 | Suzuki ....................... 341/155 |
| 6,107,889 A | | 8/2000 | Strange et al. ................ 331/17 |
| 6,191,637 B1 | * | 2/2001 | Lewicki et al. ............. 327/337 |
| 6,342,919 B1 | * | 1/2002 | Opris ......................... 348/241 |
| 6,369,554 B1 | | 4/2002 | Aram ......................... 323/282 |
| 6,384,585 B1 | | 5/2002 | Cusinato et al. ............ 323/312 |
| 6,396,334 B1 | | 5/2002 | Aram ......................... 327/541 |
| 6,400,214 B1 | | 6/2002 | Aram et al. ................. 327/541 |
| 6,441,765 B1 | | 8/2002 | Aram ......................... 341/155 |
| 6,462,695 B1 | | 10/2002 | Ahuja et al. ................ 341/161 |
| 6,465,994 B1 | * | 10/2002 | Xi .............................. 323/274 |
| 6,501,411 B1 | | 12/2002 | Soundarapandian et al. ........................... 341/161 |
| 6,535,039 B1 | | 3/2003 | Nanba et al. ............... 327/170 |
| 6,535,061 B1 | | 3/2003 | Darmawaskita et al. .... 330/254 |
| 6,552,676 B1 | | 4/2003 | Bjorksten et al. ........... 341/143 |
| 6,577,185 B1 | | 6/2003 | Chandler et al. .............. 330/9 |
| 6,839,015 B1 | * | 1/2005 | Sutardja et al. ............. 341/161 |
| 6,967,610 B1 | * | 11/2005 | Sutardja et al. ............. 341/161 |
| 6,972,707 B1 | * | 12/2005 | Anthony ..................... 341/172 |

* cited by examiner

*Primary Examiner*—Patrick Wamsley

(57) ABSTRACT

A circuit with reduced power consumption comprises first and second circuits that each have periodic active and inactive phases and that switch between the periodic active and inactive phases during operation. When the first circuit is in the active phase, the second circuit is in the inactive phase, and when the second circuit is in the active phase, the first circuit is in the inactive phase. A power supply communicates with the first and second circuits and generates first and second bias signals. The power supply selectively generates the first bias signal for the first circuit during the active phase of the first circuit, the second bias signal for the second circuit during the inactive phase of the second circuit, the second bias signal for the first circuit during the inactive phase of the first circuit, and the first bias signal for the second circuit during the active phase of the second circuit. The second bias signal is less than the first bias signal.

37 Claims, 12 Drawing Sheets

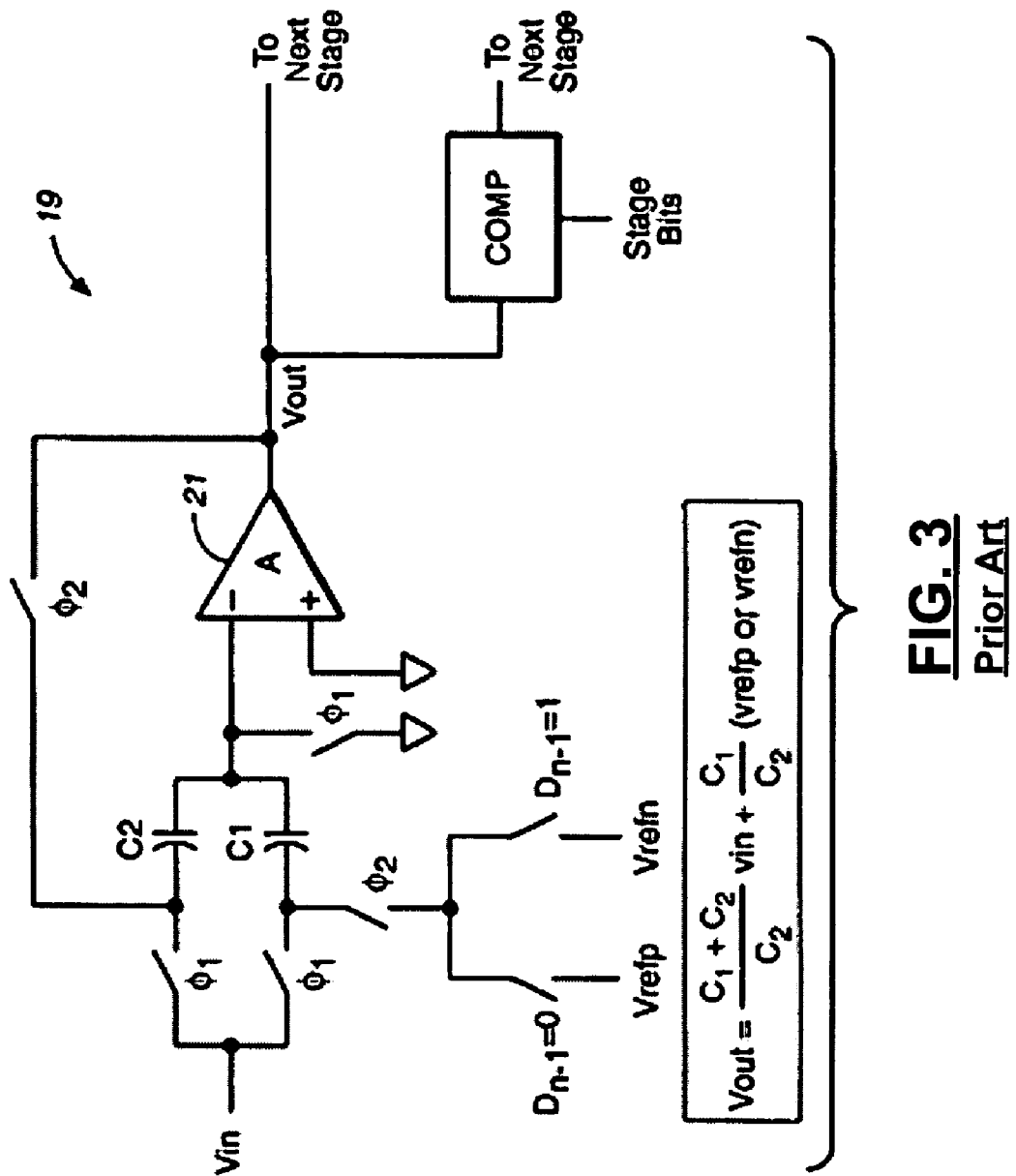
FIG. 3
_Prior Art_

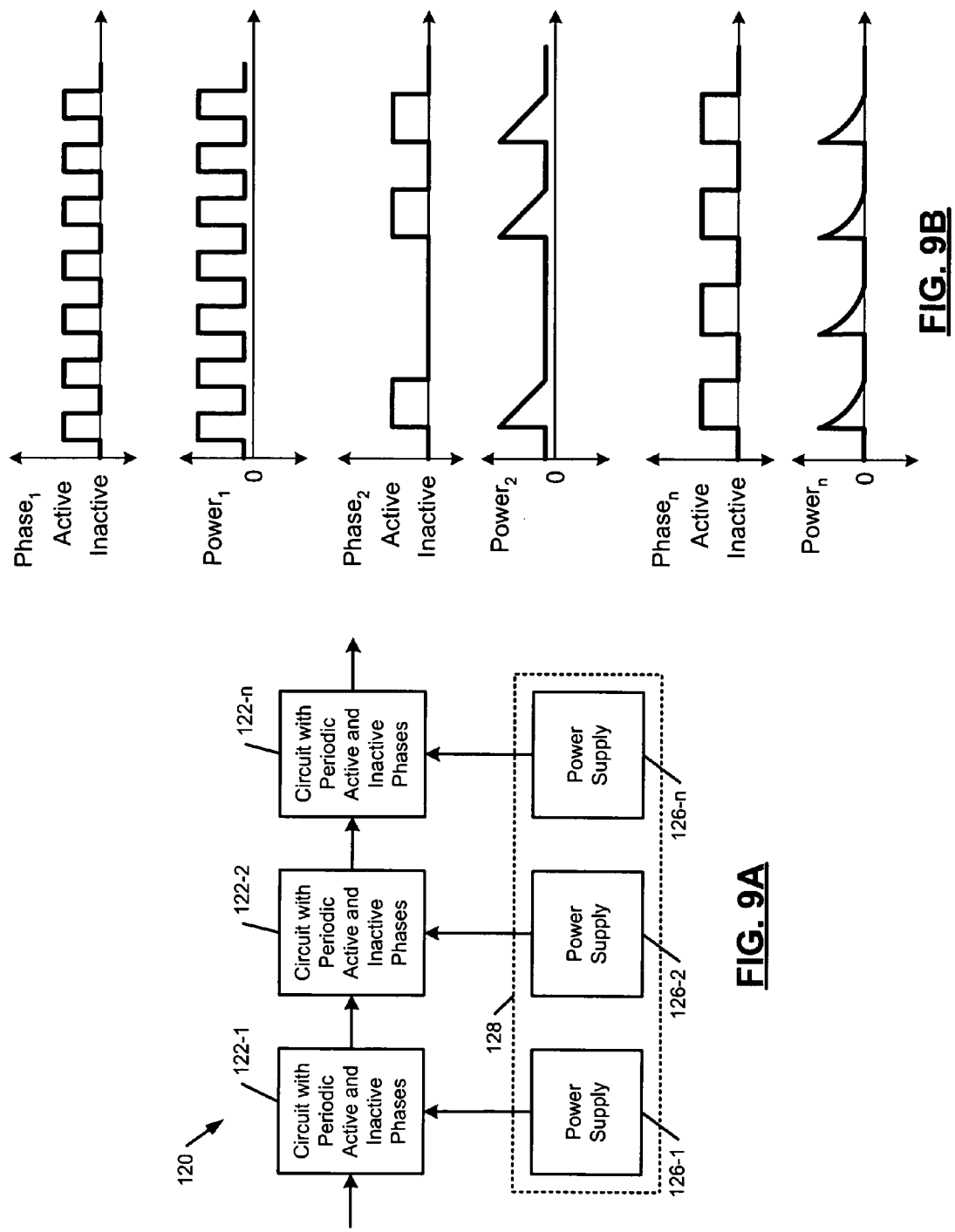

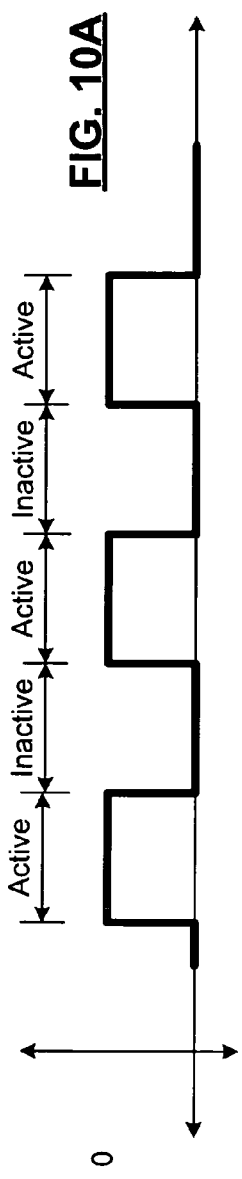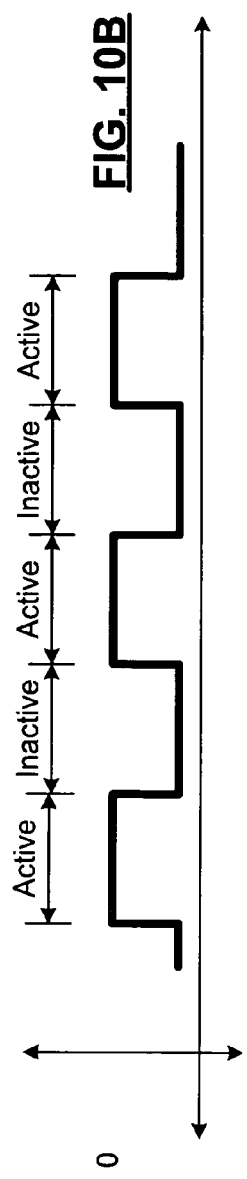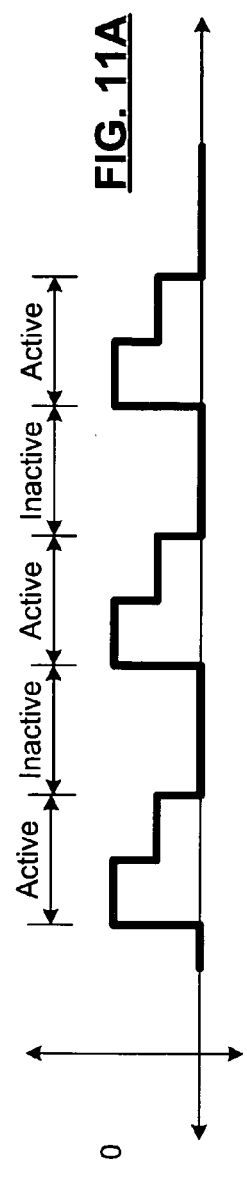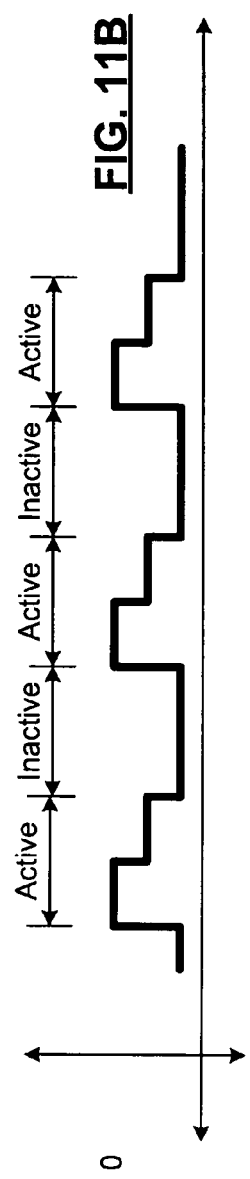

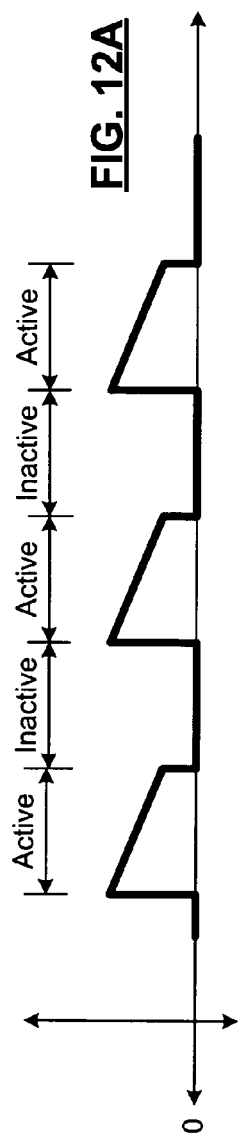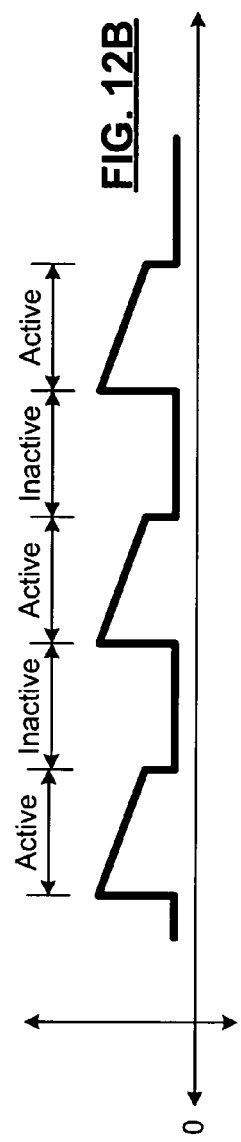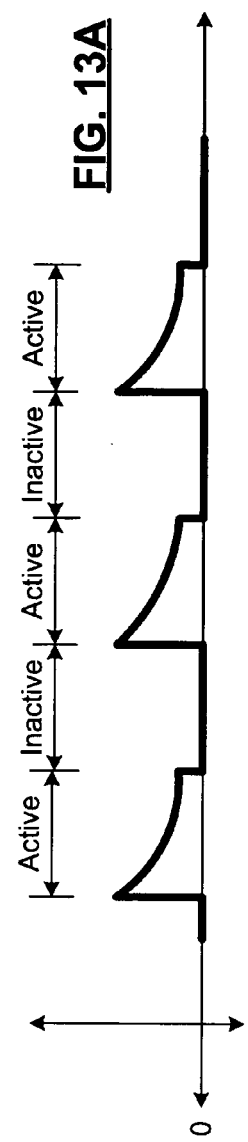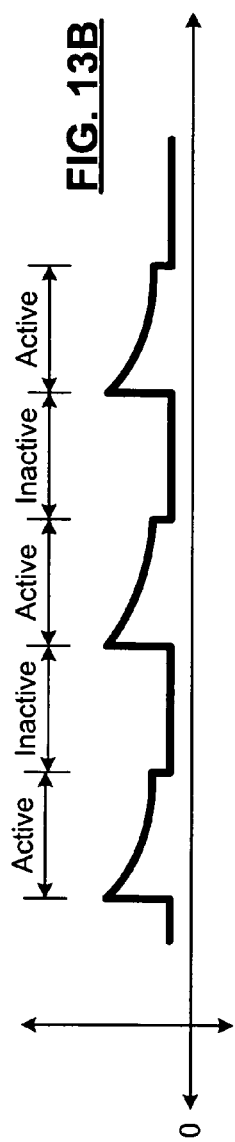

LOW POWER ANALOG TO DIGITAL CONVERTER HAVING REDUCED BIAS DURING AN INACTIVE PHASE

CROSS-REFERENCE TO RELATED APPLICATIONS

This application is a divisional of U.S. patent application Ser. No. 10/946,321, filed on Sep. 21, 2004, now U.S. Pat. No. 6,967,610 which is a divisional of U.S. patent application Ser. No. 10/313,369, filed on Dec. 6, 2002 now U.S. Pat. No. 6,839,015. The disclosures of the above applications are incorporated herein by reference in their entirety.

FIELD OF THE INVENTION

The present invention relates to a multi-stage pipelined analog to digital converter, and more particularly to a method for reducing power consumption of each stage of an analog to digital converter.

BACKGROUND OF THE INVENTION

Multi-stage pipelined analog to digital converters (ADC) provide efficient high speed conversion of analog signals to digital equivalents. A representative multi-stage pipelined ADC 10 is shown in FIG. 1. The ADC 10 generally includes a plurality of converter stages, such as stages 11, 12 and 13, arranged in series relative to each other. Each converter stage operates by comparing an analog input voltage to thresholds provided by reference signals Vrefp and Vrefn. As a result, each converter stage provides one or more bits of digital data to a digital correction circuit 15. The digital correction circuit 15, in turn, resolves the digital output from each stage into a digital output 16 that corresponds to an analog input 17.

FIG. 2 is a generalized block diagram of each converter stage. In operation, each stage accepts an analog input voltage and generates a residual analog voltage and a digital stage output. In particular, each stage applies the analog input voltage to a multiplying digital to analog converter (MDAC) 19 to generate the residual analog voltage. The residual analog voltage is then provided to a comparator 18, which generates the digital stage output. The residual analog voltage also serves as input to subsequent converter stages. This arrangement is also referred to herein as a bit-and-one-half analog to digital converter.

Each converter stage may include a switched capacitor circuit as shown in FIG. 3. The switched capacitor circuit operates in accordance with a two cycle clock with phases designated as $\Phi_1$ and $\Phi_2$. During a sampling phase, input capacitors $C_1$ and $C_2$ are charged by an input voltage $V_{in}$. In this phase, an operational amplifier 21 does not perform a function. During a subsequent integration phase, the switched capacitor circuit generates a residual output voltage. More specifically, the charge stored by the input capacitors is integrated by the operational amplifier 21 to generate an output voltage $V_{out}$. In other words, the operational amplifier 21 is active every other clock cycle. The same bias current is continuously supplied to the operational amplifier 21.

SUMMARY OF THE INVENTION

A circuit with reduced power consumption comprises a first circuit that has periodic active and inactive phases and that switches between the periodic active and inactive phases during operation of the first circuit. A second circuit communicates with the first circuit, has periodic active and inactive phases, and switches between the periodic active and inactive phases during operation of the second circuit. When the first circuit is in the active phase, the second circuit is in the inactive phase, and when the second circuit is in the active phase, the first circuit is in the inactive phase. A power supply communicates with the first and second circuits and generates first and second bias signals. The power supply selectively generates the first bias signal for the first circuit during the active phase of the first circuit, the second bias signal for the second circuit during the inactive phase of the second circuit, the second bias signal for the first circuit during the inactive phase of the first circuit, and the first bias signal for the second circuit during the active phase of the second circuit. The second bias signal is less than the first bias signal.

In other features, the first bias signal is greater than zero and the second bias signal is zero. The first and second bias signals are greater than zero. The power supply is a variable power supply that selectively provides the first and second bias signals during the periodic active and inactive phases, respectively. The power supply includes two power supplies, and only one of the two power supplies communicates with the first circuit during the inactive phase. The power supply includes a current source.

In still other features, the power supply includes a voltage source. The first circuit is one of a switched capacitor filter and an analog to digital converter. The periodic active and inactive phases of the first circuit are one of regular periodic or irregular periodic. The first bias signal is one of a square waveform, a stepped waveform having a first level followed by a second level, a linearly changing waveform, or a non-linearly changing waveform.

In other features, a circuit with reduced power consumption comprises first circuit means for switching between periodic active and inactive phases during operation of the first circuit means and second circuit means for communicating with the first circuit means and for switching between periodic active and inactive phases during operation of the second circuit means. When the first circuit means is in the active phase, the second circuit means is in the inactive phase, and when the second circuit means is in the active phase, the first circuit means is in the inactive phase. The circuit includes power supply means for communicating with the first and second circuit means and for providing first and second bias signals. The power supply means selectively generates the first bias signal for the first circuit means during the active phase of the first circuit means, the second bias signal for the second circuit means during the inactive phase of the second circuit means, the second bias signal for the first circuit means during the inactive phase of the first circuit means, and the first bias signal for the second circuit means during the active phase of the second circuit means. The second bias signal is less than the first bias signal.

In still other features, the first bias signal is greater than zero and the second bias signal is zero. The first and second bias signals are greater than zero. The power supply means is a variable power supply that selectively provides the first and second bias signals during the periodic active and inactive phases, respectively. The power supply means includes two power supplies, and only one of the two power supplies communicates with the first circuit means during the inactive phase. The power supply means includes a current source.

In still other features, the power supply means includes a voltage source. The first circuit means is one of a switched capacitor filter and an analog to digital converter. The periodic active and inactive phases of the first circuit means are one of regular periodic or irregular periodic. The first bias signal is one of a square waveform, a stepped waveform having a first level followed by a second level, a linearly changing waveform, or a non-linearly changing waveform.

In other features, a method for reducing power consumption of a circuit comprises switching a first circuit between periodic active and inactive phases during operation of the first circuit. A second circuit is switched between periodic active and inactive phases during operation of the second circuit. When the first circuit is in the active phase, the second circuit is in the inactive phase and when the second circuit is in the active phase, the first circuit is in the inactive phase. A first bias signal is selectively generated for the first circuit during the active phase of the first circuit, a second bias signal is selectively generated for the second circuit during the inactive phase of the second circuit, the second bias signal is selectively generated for the first circuit during the inactive phase of the first circuit, and the first bias signal is selectively generated for the second circuit during the active phase of the second circuit. The second bias signal is less than the first bias signal.

In still other features, the first bias signal is greater than zero and the second bias signal is zero. The first and second bias signals are greater than zero. A variable power supply is used to selectively provide the first and second bias signals during the periodic active and inactive phases, respectively. Two power supplies are provided, and only one of the two power supplies is connected to the first circuit during the inactive phase.

In still other features, the first circuit is one of a switched capacitor filter and an analog to digital converter. The first bias signal is one of a square waveform, a stepped waveform having a first level followed by a second level, a linearly changing waveform, or a non-linearly changing waveform. The periodic active and inactive phases of the first circuit are one of regular periodic or irregular periodic.

In other features, a multi-stage circuit with reduced power consumption comprises a first stage including a first circuit that has periodic active and inactive phases and that switches between the periodic active and inactive phases during operation of the first circuit, and a first power supply that selectively generates a first bias signal for the first circuit during the active phase of the first circuit and a second bias signal for the first circuit during the inactive phase of the first circuit. A second stage includes a second circuit that communicates with the first circuit, that has periodic active and inactive phases, and that switches between the periodic active and inactive phases during operation of the second circuit, and a second power supply that selectively generates the first bias signal for the second circuit during the active phase of the second circuit and the second bias signal for the second circuit during the inactive phase of the second circuit. When the first circuit is in the active phase, the second circuit is in the inactive phase, and when the second circuit is in the active phase, the first circuit is in the inactive phase. The second bias signal is less than the first bias signal.

In still other features, the first bias signal is greater than zero and the second bias signal is zero. The first and second bias signals are greater than zero. The first and second power supplies are variable power supplies that selectively provide the first and second bias signals during the periodic active and inactive phases, respectively. At least one of the first and second power supplies includes a current source.

In still other features, at least one of the first and second power supplies includes a voltage source. The first circuit is one of a switched capacitor filter and an analog to digital converter. The periodic active and inactive phases of the first circuit are one of regular periodic or irregular periodic. The first bias signal is one of a square waveform, a stepped waveform having a first level followed by a second level, a linearly changing waveform, or a non-linearly changing waveform.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

The present invention will become more fully understood from the detailed description and the accompanying drawings, wherein:

FIG. 3 is a block diagram of a conventional switched capacitor circuit which may be implemented in a converter stage of the multi-stage ADC according to the prior art;

FIG. 9A illustrates multiple circuits having regular and/or irregular periodic active and inactive phases during operation and one or more power supplies that supply first and second bias signals during the regular and/or irregular periodic active and inactive phases, respectively;

FIG. 9B illustrates exemplary regular and/or irregular periodic active and inactive phases for each of the circuits in FIG. 9A and exemplary first and second bias signals during the regular and/or irregular periodic active and inactive phases, respectively;

FIG. 10A illustrates a square-waveform bias signal and a zero bias signal for the active and inactive phases, respectively;

FIG. 10B illustrates the square-waveform bias signal of FIG. 10A and a non-zero bias signal for the active and inactive phases, respectively; FIG. 11A illustrates a stepped bias signal and a zero bias signal for the active and inactive phases, respectively:

FIG. 11B illustrates the stepped bias signal of FIG. 11A and a non-zero bias signal for the active and inactive phases, respectively;

FIG. 12A illustrates a linearly changing bias signal and a zero bias signal for the active and inactive phases, respectively;

FIG. 12B illustrates the linearly changing bias signal of FIG. 12A and a non-zero bias signal for the active and inactive phases, respectively;

FIG. 13A illustrates an exponentially changing bias signal and a zero bias signal for the active and inactive phases, respectively;

FIG. 13B illustrates the exponentially changing bias signal of FIG. 13A and a non-zero bias signal for the active and inactive phases, respectively;

DETAILED DESCRIPTION OF THE PREFERRED EMBODIMENTS

Figure 1:
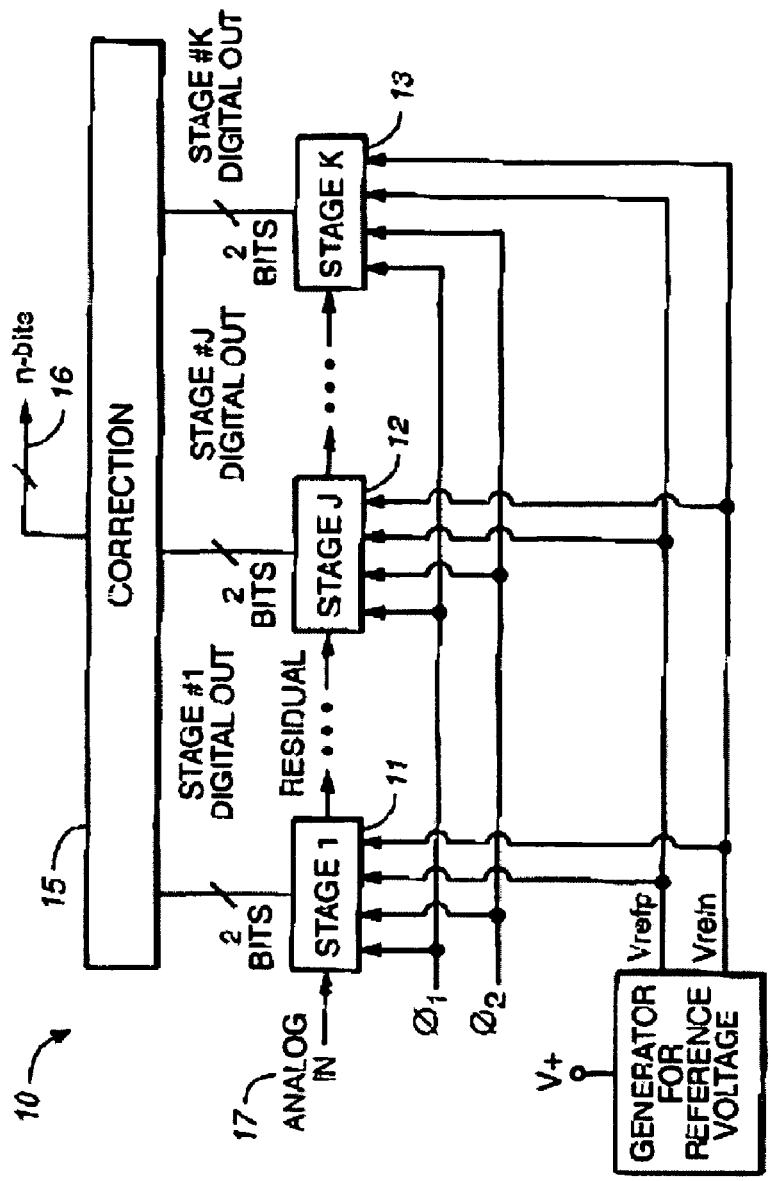
FIG. 1 is a block diagram depicting a conventional multi-stage pipelined analog to digital converter (ADC) according to the prior art.
Figure 2:
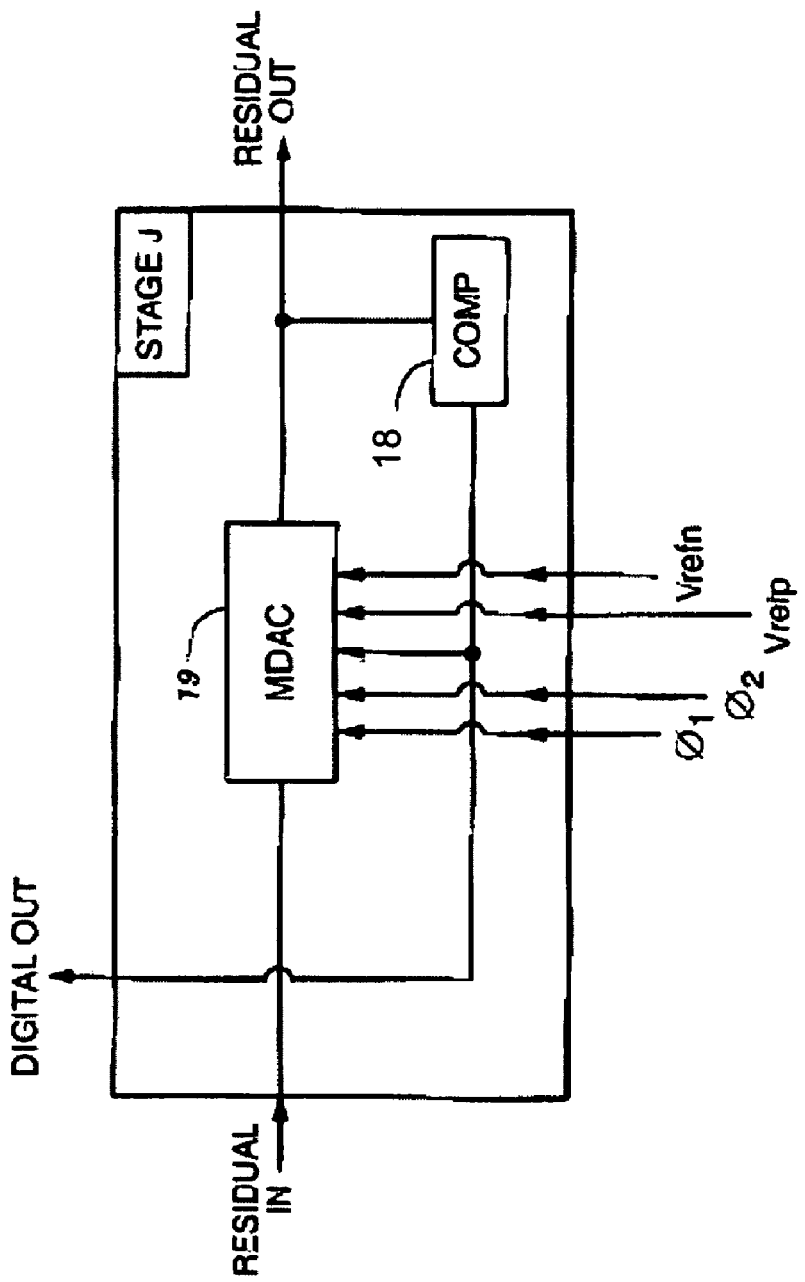
FIG. 2 is a block diagram an exemplary converter stage residing in the multi-stage ADC according to the prior art.

The following description of the preferred embodiment(s) is merely exemplary in nature and is in no way intended to limit the invention, its application, or uses. For purposes of clarity, the same reference numbers will be used in the drawings to identify similar elements.

Figure 4A:
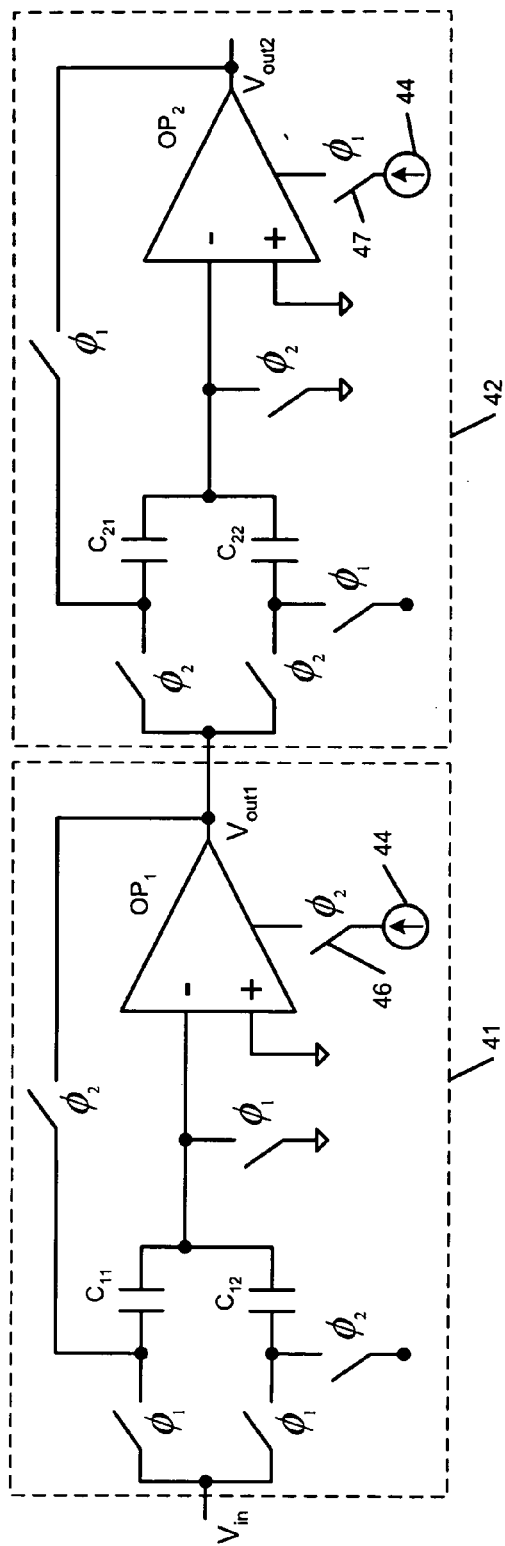
FIG. 4A is a block diagram of a first switched capacitor circuit with reduced power consumption in accordance with the present invention.

Referring now to FIG. 4A, a partial schematic of two exemplary converter stages 41, 42 of a multi-stage pipelined analog to digital converter are shown. For simplicity only two stages are shown; however, it is readily understood that an analog to digital converter may employ more converter stages. For instance, a nine bit analog to digital converter employs seven such converter stages. Moreover, it is readily understood that the operational schemes of the present invention are applicable to such converters.

Each converter stage includes a switched capacitor circuit and a comparator. As noted above, each switched capacitor circuit operates in accordance with a two cycle clock. During a first clock cycle, switches designated $\Phi_1$ are closed and switches designated $\Phi_2$ are open; whereas, during a second clock cycle, switches $\Phi_1$ are open and switches $\Phi_2$ are closed.

During the first clock cycle, input capacitors $C_{11}$, $C_{12}$ of the first stage 41 are charged by an input voltage $V_{in}$. This process is also referred to herein as the sampling phase. Concurrently, the charged stored (from a previous clock cycle) in the input capacitors $C_{21}$, $C_{22}$ of the second stage 42 is integrated by the operational amplifier $OP_2$ of the second stage 42 to generate a residual output voltage $V_{out2}$. This residual output voltage $V_{out2}$ is based on reference voltages as well as digital output from the comparator. This process is also referred to herein as the integration phase. It should be noted that the operational amplifier $OP_1$ of the first stage 41 is not active during this clock cycle.

Conversely, during the second clock cycle, input capacitors $C_{21}$, $C_{22}$ of the second stage 42 are charged by an input voltage $V_{out1}$; whereas, the charged stored in the input capacitors $C_{11}$, $C_{12}$ of the first stage 41 is integrated by the operational amplifier $OP_1$ of the first stage 41 to generate a residual output voltage $V_{out1}$. The residual output voltage $V_{out1}$ from the first stage serves as the input voltage to the second stage as shown in FIG. 4A.

Figure 4B:
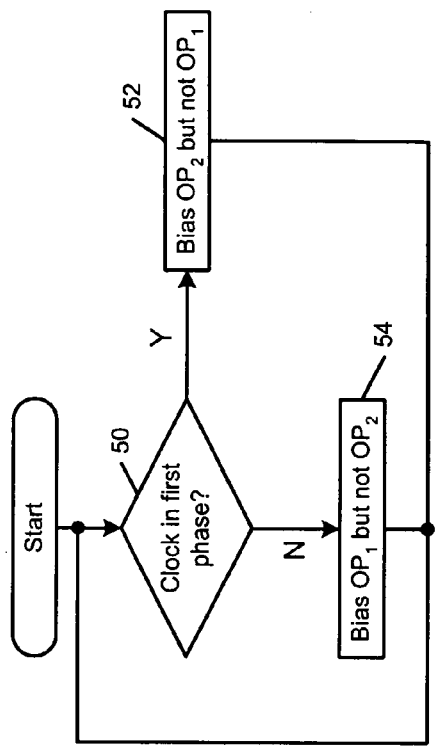
FIG. 4B is a flowchart illustrating the operation of the circuit in FIG. 4A.

In accordance with the present invention, each operational amplifier is only biased during the integration phase to reduce power consumption. Referring to FIGS. 4A and 4B, a current source 44 may be electrically connected to each of the operational amplifiers $OP_1$, $OP_2$. In addition, switching elements 46, 47 may be located between the current source 44 and each of the operational amplifiers $OP_1$, $OP_2$. During the first clock cycle or phase (as determined in step 50), a bias current is supplied to the operational amplifier $OP_2$ of the second stage 42, but not to the operational amplifier $OP_1$ of the first stage 41 (as shown in step 52). Conversely, during the second clock cycle, a bias current is supplied to the operational amplifier $OP_1$ of the first stage 41, but not to the operational amplifier $OP_2$ of the second stage 42 (as shown in step 52). In other words, each operational amplifier is biased only during its active state, thereby reducing the power consumption of the circuit.

Figure 5:
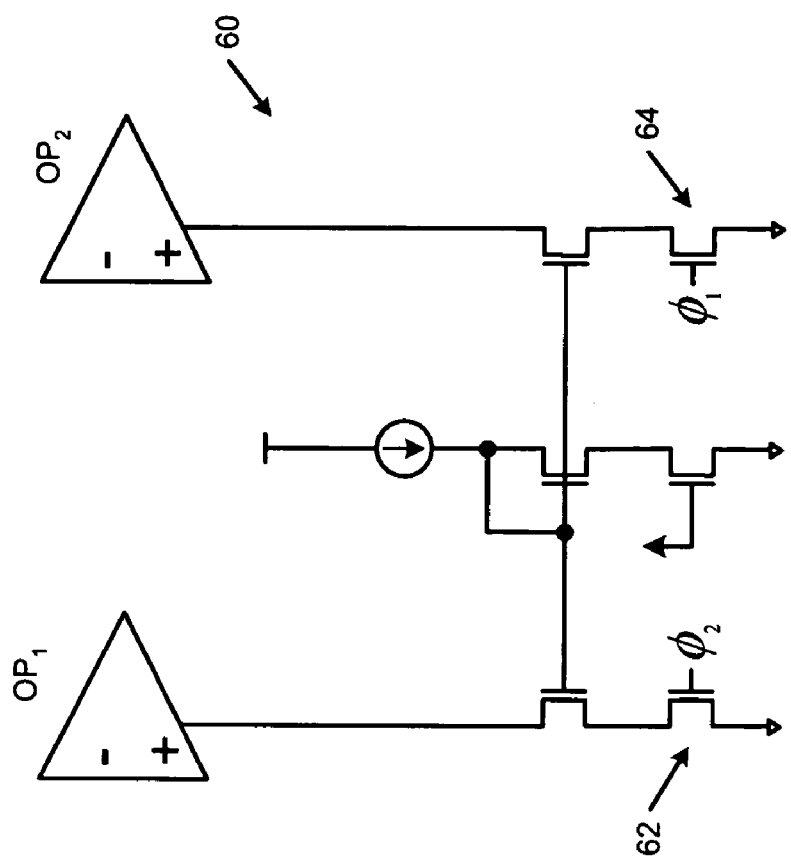
FIG. 5 illustrates a current mirror according to the prior art.

An exemplary circuit for biasing the operational amplifiers is depicted in FIG. 5. In particular, a biasing circuit 60 employs a current mirror configuration as is well known in the art. In operation, transistors 62, 64 serve as switching elements, which control when a bias current is applied to a given operational amplifier. However, it is readily understood that other circuit configurations for biasing the operational amplifiers are within the broader aspects of the present invention.

Figure 6A:
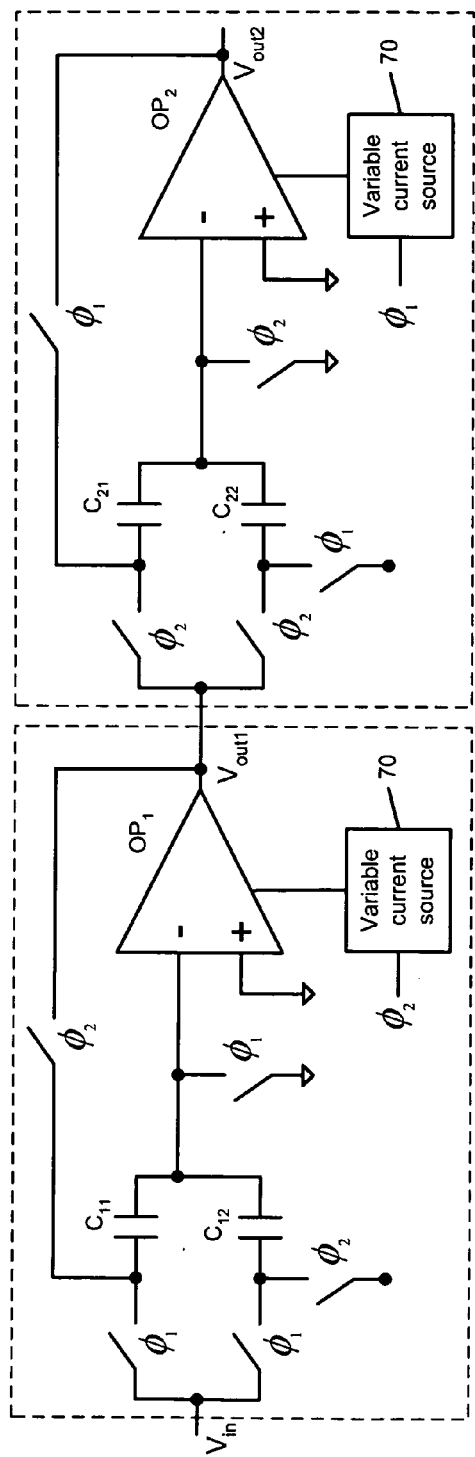
FIG. 6A is a diagram of a second switched capacitor circuit with reduced power consumption in accordance with the present invention.
Figure 7A:
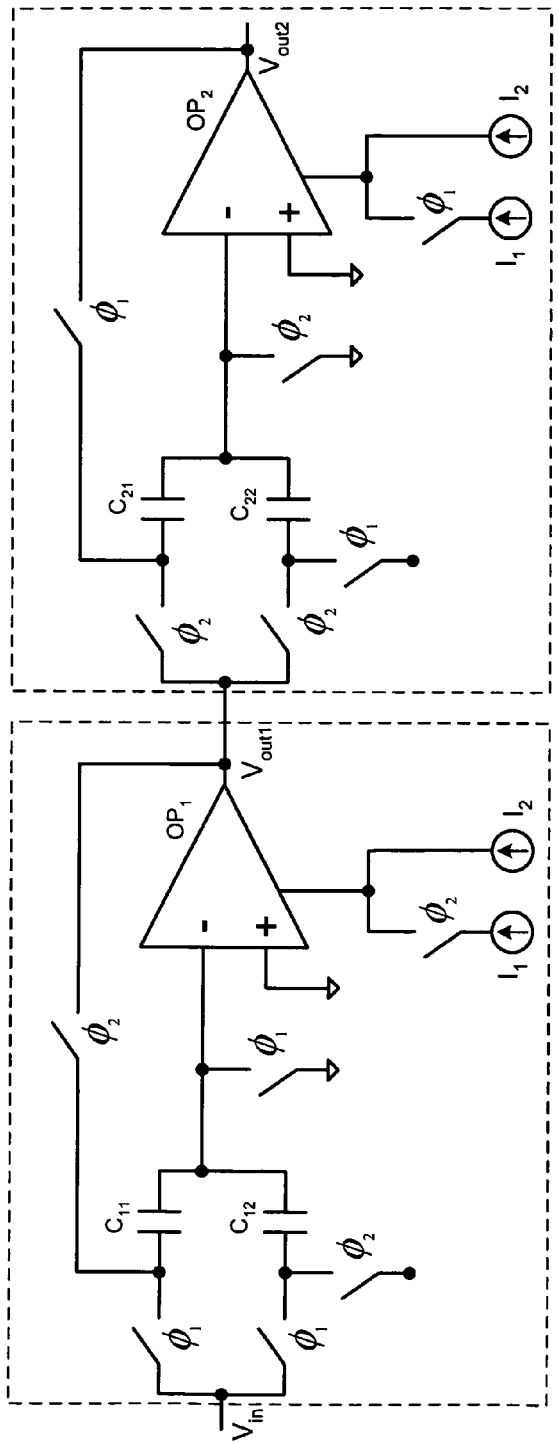
FIG. 7A is a diagram of a third switched capacitor circuit with reduced power consumption in accordance with the present invention.

In alternate embodiments depicted in FIGS. 6A and 7A, a fractional portion of the bias current may be supplied to each of the operational amplifiers during the sampling phase. In other words, each operational amplifier is supplied with a full bias current during its integration phase and with a fractional portion of the full bias current during its sampling phase. Although not limited thereto, the fractional biasing current can be 25% of the full bias current. By supplying a fractional portion of bias current, the operational amplifiers are able to maintain a common mode state during the sampling phase. The present invention reduces power consumption of the circuit while maintaining the response of the operational amplifier residing therein.

Figure 6B:
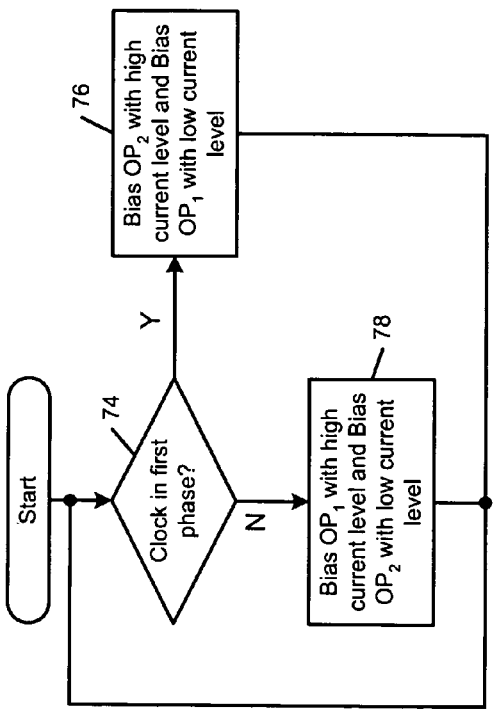
FIG. 6B is a flowchart illustrating the operation of the circuit in FIG. 6A.

Referring to FIGS. 6A and 6B, variable current sources 70 may be electrically connected to each of the operational amplifiers $OP_1$, $OP_2$. During the first clock cycle or phase (as determined in step 74), the variable current source 70 of the second stage provides a bias current having a high level to the operational amplifier $OP_2$ of the second stage 42 (as shown in step 76). The variable current source of the first stage provides a low bias current to the operational amplifier $OP_1$ of the first stage 41 (as shown in step 76).

During the second clock cycle or phase (as determined in step 74), the variable current source 70 provides a bias current having a high level to the operational amplifier $OP_1$ of the first stage 42 (as shown in step 78). The variable current sources 70 provide a low bias current to the operational amplifier $OP_2$ of the second stage 41 (as shown in step 78). In other words, one operational amplifier is biased by a high current level during its active phase and the other operational amplifier is biased by a low current level during its inactive phase, and vice-versa, to reduce the power consumption of the circuit.

The variable current sources 70 may receive clock information such as a clock signal, $\Phi_1$ and/or $\Phi_2$ as an input. In FIG. 6A, the variable current source 70 of the first stage receives $\Phi_2$ and the variable current source of the second stage receives $\Phi_1$. As can be appreciated, the variable current sources may receive other signals that will allow the variable current source to determine when the associated stage is active or inactive.

Figure 7B:
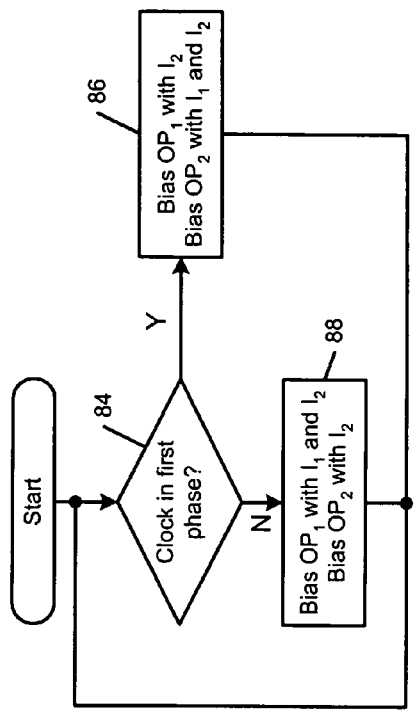
FIG. 7B is a flowchart illustrating the operation of the circuit in FIG. 7A.

Referring to FIGS. 7A and 7B, two current sources $I_1$ and $I_2$ may be selectively connected to each of the operational amplifiers $OP_1$, $OP_2$ depending upon the active/inactive phase of the stage. One of the two current sources is associated with a switch that closes during the active stage and opens during the inactive stage. During the first clock cycle or phase (as determined in step 84), the operational amplifier $OP_2$ of the second stage 42 (as shown in step 86) is biased by both current sources $I_1$ and $I_2$. The operational amplifier $OP_1$ of the first stage 41 (as shown in step 86) is biased by one current source $I_2$.

During the second clock cycle or phase (as determined in step 84), the operational amplifier $OP_2$ of the second stage 42 (as shown in step 76) is biased by one current source $I_2$. The operational amplifier $OP_1$ of the first stage 41 (as shown in step 76) is biased by both current sources $I_1$ and $I_2$. In other words, one operational amplifier is biased by a high current level during its active phase and the other operational amplifier is biased by a low current level during its inactive phase, and vice-versa, to reduce the power consumption of the circuit.

Figure 8B:
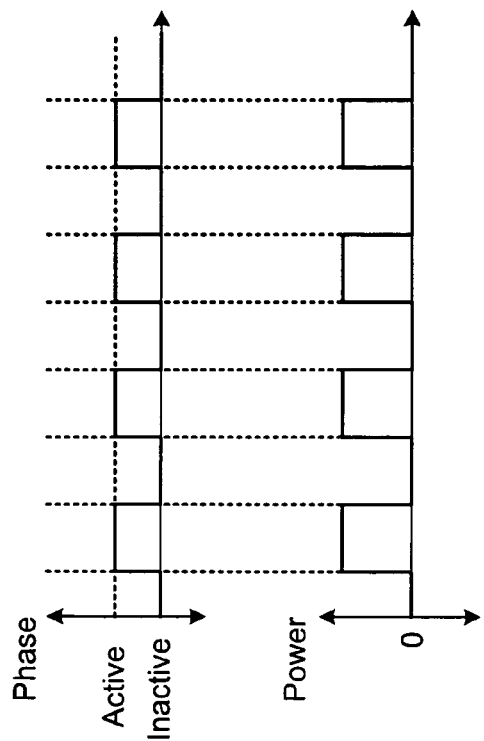
FIG. 8B illustrates exemplary regular periodic active and inactive phases for the circuit in FIG. 8A and exemplary first and second bias signals during the regular periodic active and inactive phases, respectively.
Figure 8C:
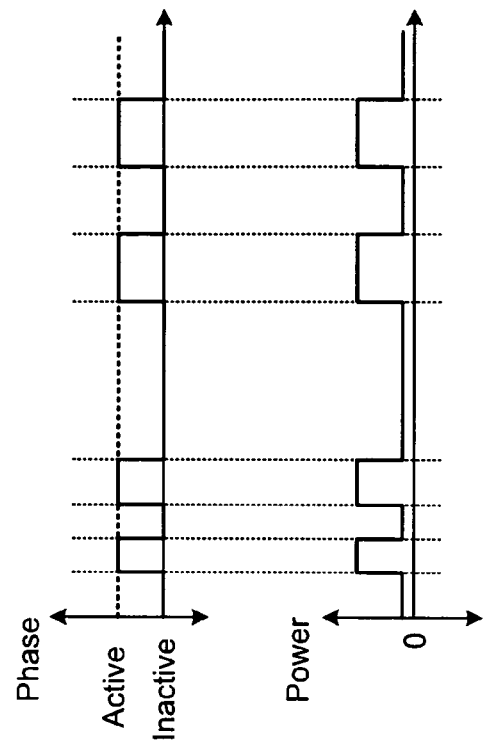
FIG. 8C illustrates exemplary irregular periodic active and inactive phases for the circuit in FIG. 8A and exemplary first and second bias signals during the irregular periodic active and inactive phases, respectively.
Figure 8A:
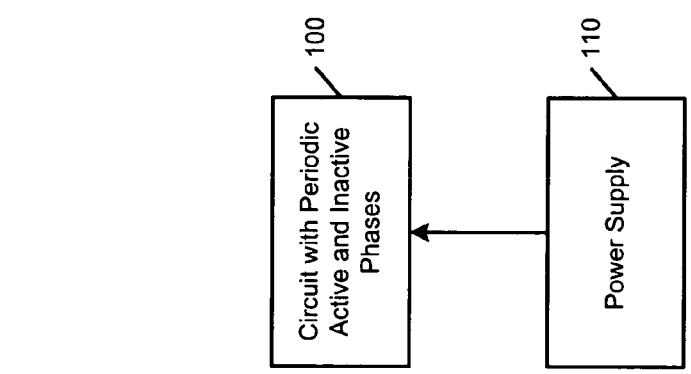
FIG. 8A illustrates a circuit having regular and/or irregular periodic active and inactive phases during operation and a power supply that supplies first and second bias signals during the regular and/or irregular periodic active and inactive phases, respectively.

Referring now to FIG. 8A, a circuit 100 having active and inactive phases during operation is shown. The active and inactive phases can be regularly periodic, or in other words, alternating at regular intervals. Alternately, the active and inactive phases can be irregularly periodic, or in other words, alternating between active and inactive phases at different intervals. A power supply 110 supplies first and second bias signals during the regular and/or irregular periodic active and inactive phases of the circuit 100, respectively. The second bias signal is lower than the first bias signal to reduce power consumption. The second bias signal can be lower during the inactive chase because the inactive phase occurs after an active phase. The circuit has already settled during the active state and is operating in steady state. When the circuit transitions to the inactive state, the circuit needs less power to operate.

The circuit 100 may provide phase feedback information to the power supply 110 if needed. The power supply 110 can be a current source such as those described above, a voltage source or any other suitable power supply. The power supply 110 can include two power supplies that are switched in a manner similar to current sources shown above in FIG. 7A or a variable or multiple output power supply similar to the variable current sources shown in FIG. 6A. Example circuits 100 include switched capacitor filters such as those described in U.S. Pat. No. 6,400,214, filed Aug. 28, 2000 to Aram et al., which is hereby incorporated by reference in its entirety and digital to analog converters such as those described above.

Referring now to FIG. 8B, exemplary regular periodic active and inactive phases for the circuit in FIG. 8A are shown. The power supply 110 generates first and second bias signals during the regular periodic active and inactive phases, respectively. Referring now to FIG. 8C, exemplary irregular periodic active and inactive Phases for the circuit in FIG. 8A are shown. The power supply 110 provides first and second bias signals during the irregular periodic active and inactive phases, respectively.

FIG. 9A illustrates a circuit 120 including multiple sub-circuits 122-1, 122-2, . . . , and 122-n having active and inactive phases during operation. The active and inactive phases of the sub-circuits 122-1, 122-2, . . . , and 122-n may be in-phase and/or out-of-phase with respect to one another. The active and inactive phases may be regular and/or irregular periodic. One or more power supplies 126-1, 126-2, . . . , and 126-n supply the first and second bias signals during the active and inactive phases, respectively. A single power supply 128 with multiple outputs may be used to provide outputs to each stage of the circuit 120. The circuit 120 and/or the sub-circuits 122-1, 122-2, . . . , and 122- n may provide phase feedback signals to the power supplies 126-1, 126-2, . . . , and 126-n if needed. Interconnections between the sub-circuits 126 may be varied from those shown. The circuit 120 may or may not be pipelined.

Referring now to FIGS. 10A-14B. exemplary first and second bias signals are shown that can be used to bias the circuits shown in FIGS. 1-9. Generally, the first bias signals occur during the active phase and have a signal level that is higher than the second bias signal that occurs during the inactive phase. The first and second bias signals can be regular or irregular periodic. The first and/or second signals can also be square-waveform or constant signals, stepped signals, linearly changing signals and/or non-linearly changing signals.

Referring now to FIGS. 10A and 10B, exemplary constant signals are shown. FIG. 10A illustrates a square-waveform bias signal and a zero bias signal for the active and inactive phases, respectively. FIG. 10B illustrates the square-waveform bias signal of FIG. 10A and a non-zero bias signal for the active and inactive phases, respectively.

Referring now to FIGS. 11A and 11B, exemplary stepped signals are shown. FIG. 11A illustrates a stepped bias signal and a zero bias signal for the active and inactive phases, respectively. The stepped bias signal may include a high startup level followed by a lower steady-state level. FIG. 11B illustrates the stepped bias signal of FIG. 11A and a non-zero bias signal for the active and inactive phases, respectively.

Referring now to FIGS. 12A and 12B. exemplary linearly changing signals are shown. FIG. 12A illustrates a linearly changing bias signal and a zero bias signal for the active and inactive phases, respectively. FIG. 12B illustrates the linearly changing bias signal of FIG. 12A and a non-zero bias signal for the active and inactive phases, respectively.

Referring now to FIGS. 13A and 13B, exemplary non-linearly changing signals are shown. FIG. 13A illustrates an exponential bias signal and a zero bias signal for the active and inactive phases, respectively. FIG. 13B illustrates the exponential bias signal of FIG. 13A and a non-zero bias signal for the active and inactive phases, respectively.

Figure 14A:
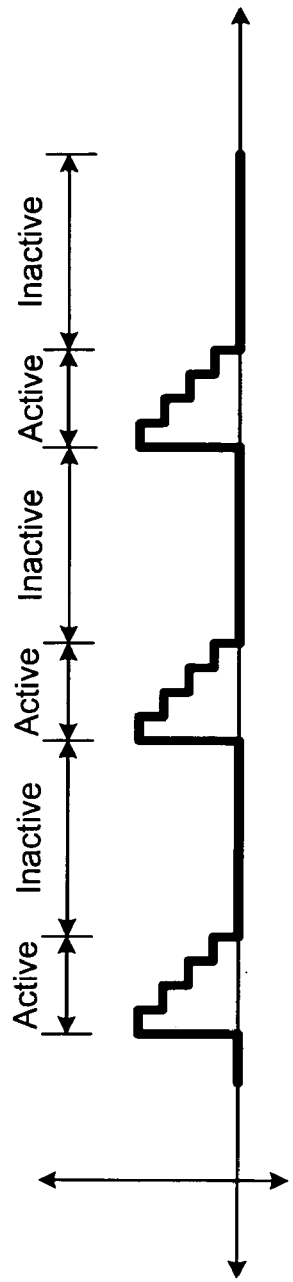
FIG. 14A illustrates a stair-stepped bias signal and a zero bias signal for the active and inactive phases, respectively.
Figure 14B:
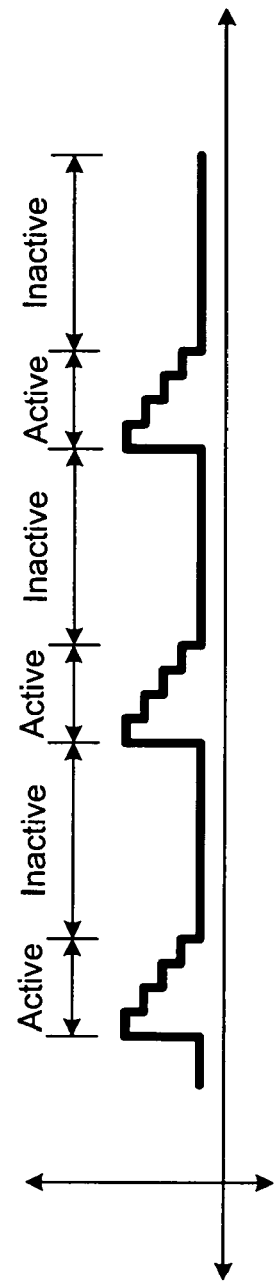
FIG. 14B illustrates the stair-stepped bias signal of FIG. 14A and a non-zero bias signal for the active and inactive phases, respectively.

Referring now to FIGS. 14A and 14B, other exemplary non- linearly changing signals are shown. FIG. 14A illustrates a stair-stepped bias signal and a zero bias signal for the active and inactive phases, respectively. FIG. 14B illustrates the stair-stepped bias signal of FIG. 14A and a non-zero bias signal for the active and inactive phases, respectively.

As can be appreciated by skilled artisans, the Present invention significantly reduces power consumption for devices having active and inactive periods. In addition, skilled artisans will appreciate that other bias waveforms can be used for the active and inactive phases in addition to those examples shown in FIGS. 10A–14B. Furthermore, the active and inactive phases need not have the same periods, for example as shown in FIGS. 14A and 14B. The duration of the active and/or inactive period may also vary from one active phase and/or inactive phase to another. While the first bias waveforms in FIGS. 11A–14B are increasing waveforms, decreasing waveforms can also be used.

Those skilled in the art can now appreciate from the foregoing description that the broad teachings of the present invention can be implemented in a variety of forms. Therefore, while this invention has been described in connection with particular examples thereof, the true scope of the invention should not be so limited since other modifications will become apparent to the skilled practitioner upon a study of the drawings, the specification and the following claims.

What is claimed is:

1. A circuit with reduced power consumption, comprising:
a first circuit that has periodic active and inactive phases and that switches between said periodic active and inactive phases during operation of said first circuit;
a second circuit that communicates with said first circuit, that has periodic active and inactive phases, and that switches between said periodic active and inactive phases during operation of said second circuit, wherein when said first circuit is in said active phase, said second circuit is in said inactive phase, and when said second circuit is in said active phase, said first circuit is in said inactive phase; and
a power supply that communicates with said first and second circuits and that generates first and second bias signals,
wherein said power supply selectively generates said first bias signal for said first circuit during said active phase of said first circuit, said second bias signal for said second circuit during said inactive phase of said second circuit, said second bias signal for said first circuit during said inactive phase of said first circuit, and said first bias signal for said second circuit during said active phase of said second circuit;
wherein said second bias signal is less than said first bias signal.

2. The circuit of claim 1 wherein said first bias signal is greater than zero and said second bias signal is zero.

3. The circuit of claim 1 wherein said first and second bias signals are greater than zero.

4. The circuit of claim 1 wherein said power supply is a variable power supply that selectively provides said first and second bias signals during said periodic active and inactive phases, respectively.

5. The circuit of claim 1 wherein said power supply includes two power supplies, and wherein only one of said two power supplies communicates with said first circuit during said inactive phase.

6. The circuit of claim 1 wherein said power supply includes a current source.

7. The circuit of claim 1 wherein said power supply includes a voltage source.

8. The circuit of claim 1 wherein said first circuit is one of a switched capacitor filter and an analog to digital converter.

9. The circuit of claim 1 wherein said periodic active and inactive phases of said first circuit are one of regular periodic or irregular periodic.

10. The circuit of claim 1 wherein said first bias signal is one of a square waveform, a stepped waveform having a first level followed by a second level, a linearly changing waveform, or a non-linearly changing waveform.

11. A circuit with reduced power consumption, comprising:
first circuit means for switching between periodic active and inactive phases during operation of said first circuit means;
second circuit means for communicating with said first circuit means and for switching between periodic active and inactive phases during operation of said second circuit means, wherein when said first circuit means is in said active phase, said second circuit means is in said inactive phase, and when said second circuit means is in said active phase, said first circuit means is in said inactive phase; and
power supply means for communicating with said first and second circuit means and for providing first and second bias signals,
wherein said power supply means selectively generates said first bias signal for said first circuit means during said active phase of said first circuit means, said second bias signal for said second circuit means during said inactive phase of said second circuit means, said second bias signal for said first circuit means during said inactive phase of said first circuit means, and said first bias signal for said second circuit means during said active phase of said second circuit means, and
wherein said second bias signal is less than said first bias signal.

12. The circuit of claim 11 wherein said first bias signal is greater than zero and said second bias signal is zero.

13. The circuit of claim 11 wherein said first and second bias signals are greater than zero.

14. The circuit of claim 11 wherein said power supply means is a variable power supply that selectively provides said first and second bias signals during said periodic active and inactive phases, respectively.

15. The circuit of claim 11 wherein said power supply means includes two power supplies, and wherein only one of said two power supplies communicates with said first circuit means during said inactive phase.

16. The circuit of claim 11 wherein said power supply means includes a current source.

17. The circuit of claim 11 wherein said power supply means includes a voltage source.

18. The circuit of claim 11 wherein said first circuit means is one of a switched capacitor filter and an analog to digital converter.

19. The circuit of claim 11 wherein said periodic active and inactive phases of said first circuit means are at least one of regular periodic and irregular periodic.

20. The circuit of claim 11 wherein said first bias signal is at least one of a square waveform, a stepped waveform having a first level followed by a second level, a linearly changing waveform, and a non-linearly changing waveform.

21. A method for reducing power consumption of a circuit, comprising:
switching a first circuit between periodic active and inactive phases during operation of said first circuit;
switching a second circuit between periodic active and inactive phases during operation of said second circuit, wherein when said first circuit is in said active phase, said second circuit is in said inactive phase and when said second circuit is in said active phase, said first circuit is in said inactive phase; and
selectively generating a first bias signal for said first circuit during said active phase of said first circuit, a second bias signal for said second circuit during said inactive phase of said second circuit, said second bias signal for said first circuit during said inactive phase of said first circuit, and said first bias signal for said second circuit during said active phase of said second circuit, wherein said second bias signal is less than said first bias signal.

22. The method of claim 21 wherein said first bias signal is greater than zero and said second bias signal is zero.

23. The method of claim 21 wherein said first and second bias signals are greater than zero.

24. The method of claim 21 further comprising using a variable power supply to selectively provide said first and second bias signals during said periodic active and inactive phases, respectively.

25. The method of claim 21 further comprising:
providing two power supplies; and
connecting only one of said two power supplies to said first circuit during said inactive phase.

26. The method of claim 21 wherein said first circuit is one of a switched capacitor filter and an analog to digital converter.

27. The method of claim 21 wherein said first bias signal is one of a square waveform, a stepped waveform having a first level followed by a second level, a linearly changing waveform, or a non-linearly changing waveform.

28. The method of claim 21 wherein said periodic active and inactive phases of said first circuit are one of regular periodic or irregular periodic.

29. A multi-stage circuit with reduced power consumption, comprising:
a first stage including a first circuit that has periodic active and inactive phases and that switches between said periodic active and inactive phases during operation of said first circuit, and a first power supply that selectively generates a first bias signal for said first circuit during said active phase of said first circuit and a second bias signal for said first circuit during inactive phase of said first circuit; and a second stage including a second circuit that communicates with said first circuit, that has periodic active and inactive phases, and that switches between said periodic active and inactive phases during operation of said second circuit, and a second power supply that selectively generates said first bias signal for said second circuit during said active phase of said second circuit and said second bias signal for said second circuit during said inactive phase of said second circuit, wherein when said first circuit is in said active phase, said second circuit is in said inactive phase, and when said second circuit is in said active phase, said first circuit is in said inactive phase, and wherein said second bias signal is less than said first bias signal.

30. The circuit of claim 29 wherein said first bias signal is greater than zero and said second bias signal is zero.

31. The circuit of claim 29 wherein said first and second bias signals are greater than zero.

32. The circuit of claim 29 wherein said first and second power supplies are variable power supplies that selectively provide said first and second bias signals during said periodic active and inactive phases, respectively.

33. The circuit of claim 29 wherein at least one of said first and second power supplies includes a current source.

34. The circuit of claim 29 wherein at least one of said first and second power supplies includes a voltage source.

35. The circuit of claim 29 wherein said first circuit is one of a switched capacitor filter and an analog to digital converter.

36. The circuit of claim 29 wherein said periodic active and inactive phases of said first circuit are one of regular periodic or irregular periodic.

37. The circuit of claim 29 wherein said first bias signal is one of a square waveform, a stepped waveform having a first level followed by a second level, a linearly changing waveform, or a non-linearly changing waveform.

* * * * *

UNITED STATES PATENT AND TRADEMARK OFFICE
CERTIFICATE OF CORRECTION

PATENT NO. : 7,071,863 B1  
APPLICATION NO. : 11/242691  
DATED : July 4, 2006  
INVENTOR(S) : Sehat Sutardja et al.

It is certified that error appears in the above-identified patent and that said Letters Patent is hereby corrected as shown below:

Column 4, Line 24      Insert --of-- after "diagram"  
Column 5, Line 61      Delete "charged" and insert --charge--  
Column 6, Line 26      Delete "state" and insert --phase--  
Column 7, Line 44      Delete "chase" and insert -- phase --

Signed and Sealed this

Ninth Day of January, 2007

JON W. DUDAS  
*Director of the United States Patent and Trademark Office*